US012787869B2

(12) United States Patent
Suthram et al.

(10) Patent No.: US 12,787,869 B2

(45) Date of Patent: Nov. 3, 2026

(54) PACKAGE ARCHITECTURE WITH MEMORY CHIPS HAVING DIFFERENT PROCESS REGIONS

(71) Applicant: Intel Corporation, Santa Clara, CA (US)

(72) Inventors: Sagar Suthram, Portland, OR (US); Wilfred Gomes, Portland, OR (US); Nisha Ananthakrishnan, Chandler, AZ (US); Kemal Aygun, Tempe, AZ (US); Ravindranath Vithal Mahajan, Chandler, AZ (US); Debendra Mallik, Chandler, AZ (US); Pushkar Sharad Ranade, San Jose, CA (US); Abhishek A. Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 18/148,533

(22) Filed: Dec. 30, 2022

(65) Prior Publication Data

US 2024/0222321 A1 Jul. 4, 2024

(51) Int. Cl.

*H10W 90/00* (2026.01)

*H10W 72/00* (2026.01)

(52) U.S. Cl.

CPC .......... *H10W 90/00* (2026.01); *H10W 72/823* (2026.01)

(58) Field of Classification Search

None

See application file for complete search history.

(56) References Cited

U.S. PATENT DOCUMENTS

2020/0219815 A1* 7/2020 Elsherbini ............. H10W 40/22

2022/0342150 A1* 10/2022 Karhade .............. G02B 6/1225

* cited by examiner

*Primary Examiner* — Bo B Jang

(74) *Attorney, Agent, or Firm* — Akona IP PC

(57) ABSTRACT

Embodiments of a microelectronic assembly include: a first integrated circuit (IC) die having a first memory circuit and a second memory circuit; a second IC die; a third IC die; and a package substrate. The second IC die is between the first IC die and the package substrate. The first IC die includes: a first portion comprising a first active region and a first backend region in contact with the first active region; and a second portion comprising a second active region and a second backend region in contact with the second active region. The first memory circuit is in the first portion, the second memory circuit is in the second portion, the first active region comprises transistors that are larger than transistors in the second active region, and the first backend region comprises conductive traces that have a larger pitch than conductive traces in the second backend region.

15 Claims, 10 Drawing Sheets

PACKAGE ARCHITECTURE WITH MEMORY CHIPS HAVING DIFFERENT PROCESS REGIONS

TECHNICAL FIELD

The present disclosure relates to techniques, methods, and apparatus directed to a package architecture with memory chips having different process regions.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
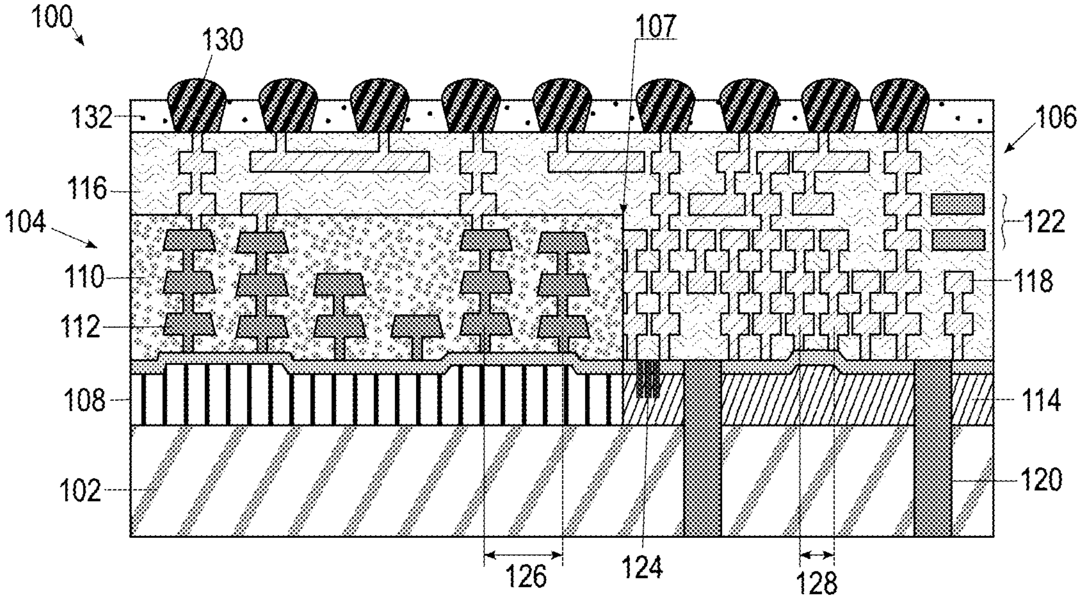
FIG. 1A is a simplified cross-sectional view of an example IC die according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

The demand for miniaturization of form factor and increased levels of integration for high performance are driving sophisticated packaging approaches in the semiconductor industry. Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SOC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout; this has different manufacturing requirements compared to a USB controller, which is built to meet certain USB standards, rather than for processing speed; by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In another example, called Embedded Multi-Die Interconnect Bridge (EMIB™), a silicon bridge embedded under the edges of two interconnecting dies facilitates electrical coupling between them. The bridge die may be embedded in a package substrate, facilitating an omni-directional interconnect (ODI™), which allows for top-packaged chips to communicate with other chips horizontally using the bridge die and vertically, using Through-Mold Vias (TMVs) in the package substrate. Such die partitioning enables miniaturization of small form factor and high performance without yield issues seen with other methods but needs fine die-to-die interconnections. The EMIB can facilitate such high-density interconnections by inserting the bridge dies only where needed. Standard flip-chip assembly is used for robust power delivery and to connect high-speed signals directly from chip to the package substrate.

Even with such advanced packaging technologies, future trends suggest increasingly high challenges for various memory devices. For example, static random-access memory (SRAM) is a type of memory circuit in which data is stored in transistors and requires a constant power flow. Because of the continuous power, SRAM circuits do not need to be refreshed to remember the data being stored. In dynamic random-access memory (DRAM), data is stored in capacitors. Capacitors that store data in DRAM gradually discharge energy and thus, a periodic refresh of power is required to function. In a general sense, SRAM circuits comprise transistor memory cells whereas DRAM circuits comprise transistors and capacitors. Since SRAM circuits use a larger number of transistors than DRAM circuits, the fabrication of SRAM circuits is more complex than of DRAM circuits. SRAM circuits are faster than DRAM circuits but store less data and are also more expensive to fabricate. For example, RAM circuits operate at speeds in a range between 20 nanoseconds and 50 nanoseconds whereas DRAM circuits operate at speeds in a range between 60 nanoseconds and 100 nanoseconds, making DRAM circuits less suitable than SRAMs for high-bandwidth applications. On the other hand, DRAM circuits can store more data than SRAM circuits, making DRAM circuits more suitable for high-capacity applications. In current memory applications, SRAM circuits are used in cache memory, located close to compute circuits for faster access, whereas DRAM circuits are used in main memory and may be farther away from compute circuits. In future memory applications, it may be advantageous to combine the efficacies of SRAM circuits with the cost effectiveness and storage capacities of DRAM circuits in a single IC to enable faster, cheaper, and higher capacity memory devices.

Accordingly, embodiments of a microelectronic assembly include: a first IC die having a first memory circuit and a second memory circuit; a second IC die; a third IC die; and a package substrate. The first IC die is between the second IC die and the package substrate, the first IC die comprises: a first portion comprising a first active region and a first backend region in contact with the first active region; and a second portion comprising a second active region and a second backend region in contact with the second active region. The first memory circuit is in the first portion, the second memory circuit is in the second portion, the first active region comprises transistors that are larger than transistors in the second active region, and the first backend region comprises conductive traces that have a larger pitch than conductive traces in the second backend region.

Some other embodiments disclose an IC structure, including: a substrate comprising a semiconductor material; a first portion comprising a first active region and a first backend region; and a second portion comprising a second active region and a second backend region. The first portion is in contact with the second portion along an interface, the first active region and the second active region are in the substrate, the first active region comprises transistors that are larger than transistors in the second active region, the first backend region comprises conductive traces that have a larger pitch than conductive traces in the second backend region.

Some other embodiments disclose an IC structure, comprising: a substrate having a first side and a second side; a first portion comprising a first active region and a first backend region; and a second portion comprising a second active region and a second backend region. The first portion is on the first side of the substrate, the second portion is on the second side of the substrate, the first active region comprises transistors that are larger than transistors in the second active region, and the first backend region comprises conductive traces that have a larger pitch than conductive traces in the second backend region.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "optical structure" includes arrangements of forms fabricated in ICs to receive, transform and/or transmit optical signals as described herein. It may include optical conductors such as waveguides, electromagnetic radiation sources such as lasers and light-emitting diodes (LEDs) and electro-optical devices such as photodetectors.

In various embodiments, any photonic IC (PIC) described herein may comprise a semiconductor material including, for example, N-type or P-type materials. The PIC may include, for example, a crystalline base material formed using a bulk silicon (or other bulk semiconductor material) or a SOI structure (or, in general, a semiconductor-on-insulator structure). In some embodiments, the PIC may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the PIC may comprise a non-crystalline material, such as polymers. In some embodiments, the PIC may be formed on a printed circuit board (PCB). In some embodiments, the PIC may be inhomogeneous, including a carrier material (such as glass or silicon carbide) as a base material with a thin semiconductor layer over which is an active side comprising transistors and like components. Although a few examples of the material for the PIC are described here, any material or structure that may serve as a foundation upon which the PIC may be built falls within the spirit and scope of the present disclosure.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photo-imageable polymers, dry film photo-imageable polymers, acrylics, solvents) may be provided in an IC package described herein and may not be labeled or shown to avoid cluttering the drawings. Solder resist may be a liquid or dry film material including photo-imageable polymers. In some embodiments, solder resist may be non-photo-imageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
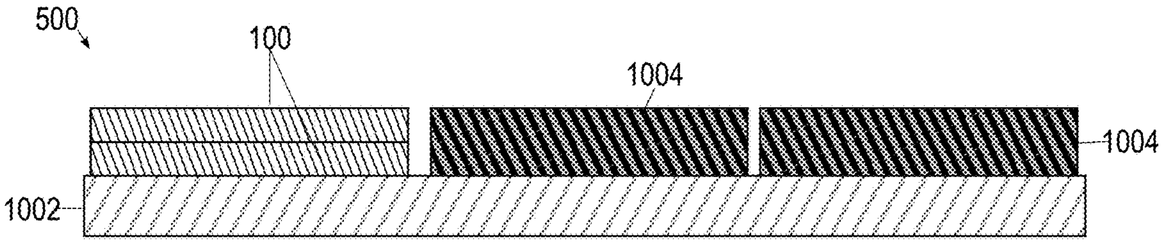
FIG. 10 is a simplified cross-sectional view of an example microelectronic assembly according to some embodiments of the present disclosure.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1A is a schematic cross-sectional view of an example IC die 100 according to some embodiments of the present disclosure. A portion of IC structure in IC die 100 as shown in the figure comprises a substrate 102 of a semiconductor material as listed in the previous subsection. Substrate 102 includes a portion 104 and a portion 106 in contact with portion 104 along an interface 107. Portion 104 comprises an active region 108 and a backend region 110 having conductive traces 112 in an inorganic dielectric material. Portion 106 comprises an active region 114 and a backend region 116 having conductive traces 118 in an inorganic dielectric material. In various embodiments, the inorganic dielectric materials in respective backend regions 110 and 116 may comprise the same interlayer dielectric (ILD) material; in other embodiments, the inorganic dielectric materials may comprise different ILD materials. Examples of high-k ILD materials include silica (SiO2), hafnium silicate (HfSiO4), zirconium silicate (ZrSiO4), and barium titanate ($BaTiO_3$). Examples of low-k ILD materials include carbon or fluorine doped silicon dioxide, organosilicate glass (OSG), and various silsesquioxanes.

As used herein, the term "backend region" (or "back-end region" or "back end region" or "back end of line (BEOL)") such as, backend regions 110 and 116, refers to a region in semiconductor device that comprises conductive traces and vias enabling conductive coupling of the active elements in the frontend region. The backend region includes contacts (e.g., pads that contact active elements), insulating layers (e.g., dielectric layers), metal levels (e.g., conductive traces and vias), and bonding sites, such as, bond-pads for chip-to-package connections and chip-to-chip connections. In some semiconductor devices, there may be more than 10 layers of dielectric layers between the active region and the bonding sites. In some embodiments, backend regions 110 and 116 do not include semiconductor material or active devices fabricated in semiconductor materials.

In various embodiments, fabrication of backend region 110 and 116 includes formation of contacts and dielectric structures. For example, the processing generally begins when a layer of a conducting metal such as, copper or aluminum, is deposited on top of active region 108 and/or 114. A layer of UV-sensitive photoresist is added on the top of the metal. Then, a UV-light source is exposed to the photoresist through a mask describing the desired layout of the metal wires; the inactivated section of the photoresist is then removed in the subsequent chemical etching step. The etching process eliminates the unprotected metal to obtain a pattern of wires described by the mask which connects the different active elements in active region 108 (or 114). ILD materials may be deposited on the conductive wiring, and the processes repeated until a desired stack of conductive traces 112 is obtained. The various layers of conductive traces 112 are interconnected by conductive vias in the dielectric material.

In some embodiments, active regions 108 and 114 are formed by ion implantation processes in substrate 102 along with other processes, including photolithography, doping, etching, masking, etc. Active region 108 comprises transistors that are larger than transistors in active region 114. Backend region 110 comprises conductive traces 112 that have a larger pitch 126 than pitch 128 of conductive traces 118 in backend region 116. In various embodiments, TSVs 120 are located in portion 106, and TSVs 120 extend through active region 114. In some embodiments, active region 108 may not contain any TSVs 120 therethrough, and in some other embodiments, active region 108 may contain TSVs 120 therethrough. In some embodiments, portion 104 may comprise SRAM circuits and portion 106 may comprise DRAM circuits. In some other embodiments, portion 104 may comprise DRAM circuits and portion 106 may comprise SRAM circuits. In some embodiments, portion 104 and portion 106 may both comprise DRAM circuits. In some embodiments, portion 104 and portion 106 may both comprise SRAM circuits. In various embodiments, portion 106 may comprise various types of capacitors, for example, metal-insulator-metal (MIM) capacitors 122 in backend region 116 and/or trench capacitors 124 in active region 114.

In various embodiments, portion 104 may be fabricated using a different semiconductor process compared to portion 106. For example, portion 104 may be fabricated using an older semiconductor process, or a semiconductor process tailored for DRAM circuits rather than SRAM circuits, or vice versa. As a result, transistors in active region 108 may be differently sized than transistors in active region 114. In some embodiments, transistors in active region 108 may be larger than transistors in active region 114. In other embodiments, transistors in active region 108 may be smaller than transistors in active region 114. Further, conductive traces 112 in backend region 110 may be differently sized than conductive traces 118 in backend region 116. In some embodiments, conductive traces 112 in backend region 110 may be larger than conductive traces 118 in backend region 116. In other embodiments, conductive traces 112 in backend region 110 may be smaller than conductive traces 118 in backend region 116. In various embodiments, conductive traces 112 may be disposed in numerous layers, numbering from one to five. In other embodiments, conductive traces 118 may be disposed in a greater number of layers than conductive traces 112. In various embodiments, pitch 126 between conductive traces 112 in portion 104 may be different than pitch 128 between conductive traces 118 in portion 106. In some embodiments, pitch 126 may be larger than pitch 128. In other embodiments, pitch 126 may be the same or smaller than pitch 128. In some embodiments, backend region 116 may extend over backend region 110 as shown in the figure.

In various embodiments, interconnects 130 may be formed on a surface of IC die 100, for example, by a bumping operation where interconnects 130 comprise flip-chip bumps. In other embodiments, interconnects 130 may comprise copper pillars or other types as described in the previous subsection in reference to DTD interconnects and DTPS interconnects. In various embodiments, interconnects 130 may comprise DTD interconnects; in other embodiments, interconnects 130 may comprise DTPS interconnects. A redistribution layer 132 comprising an organic dielectric material, such as solder resist, or polyimide, may be disposed around interconnects 130. In some embodiments, redistribution layer 132 may comprise several layers of organic dielectric material and conductive traces. In other embodiments, redistribution layer 132 may comprise one or more layers of solder resist.

Figure 1B:
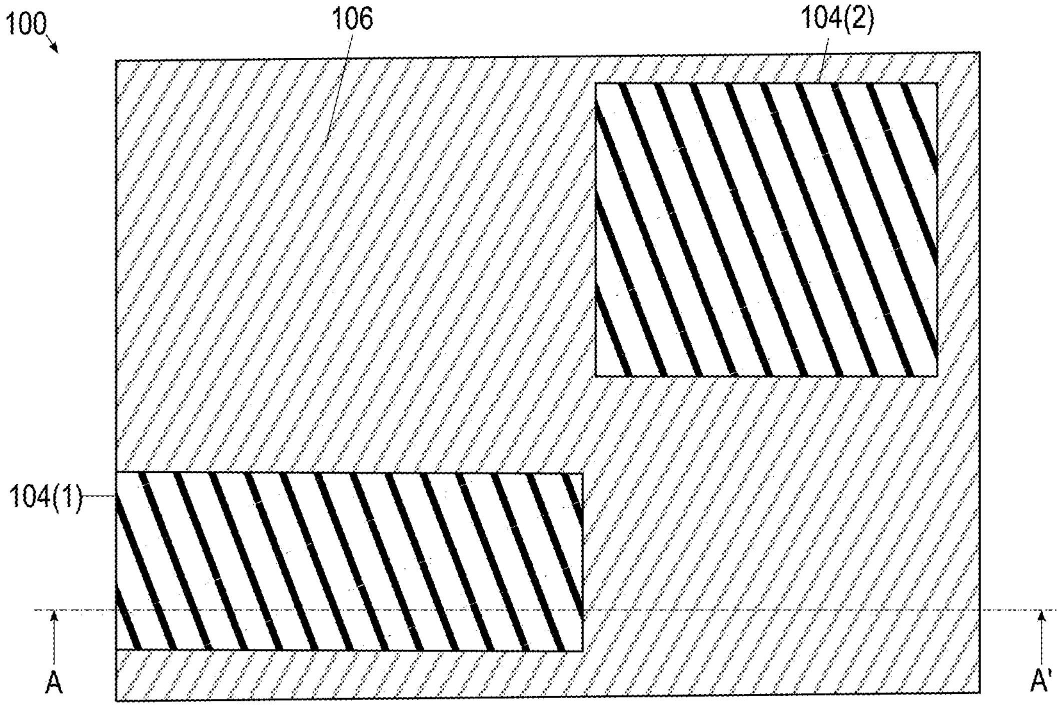
FIG. 1B is a simplified plan view of the example IC die of FIG. 1A according to some embodiments.

FIG. 1B shows a plan view of the IC structure of FIG. 1A. In various embodiments, IC die 100 may be fabricated on a preexisting wafer comprising portion 104 on substrate 102. Portion 104 may comprise one, two, or three metal layers of conductive traces 112. Trenches may be formed in, on, or around portion 104 in certain areas until substrate 102 is exposed in the trenches. Portion 106 may be fabricated in the trenches. In some embodiments, additional sections of portion 106 may be fabricated on portion 104, to create a composite memory die having two different types (e.g., variations) of memory circuits. For example, as shown in FIG. 1B, IC die 100 may comprise more than one of portion 104, for example, 104(1) and 104(2), surrounded by portion 106.

Figure 1C:
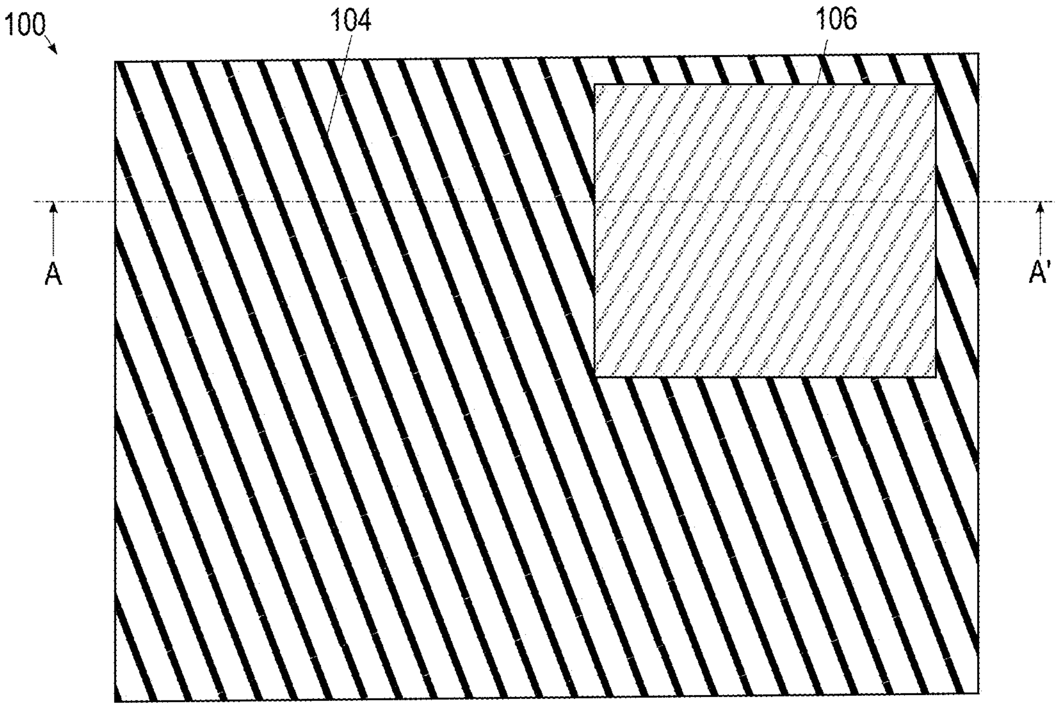
FIG. 1C is a simplified plan view of the example IC die of FIG. 1A according to some embodiments.

FIG. 1C is a plan view of another embodiment (or location) in IC die 100, in which portion 106 is surrounded by portion 104. In some such embodiments, portions 106 may comprise SRAM-like DRAM circuits. In other words, portion 104 may comprise a DRAM circuit made using an older process, and portion 106 may comprise another DRAM circuit made using a newer process that enables faster speeds, closer to SRAM circuits. The combination of the two processes on the same IC die 100 may enable higher bandwidth and higher capacity simultaneously while keeping manufacturing costs down. A bank of such IC die 100 with both moderate bandwidth DRAM circuits and high-bandwidth (e.g., SRAM-like DRAM) DRAM circuits may be provided in a stack of IC die 100 in some embodiments. In some embodiments, such custom DRAM stacks may replace L2/L3 caches in compute dies or microelectronic assemblies. Note that the shapes of portions 104 and 106 are shown as rectangular merely for ease of illustration. Any suitable shape as dictated by circuit design and/or manufacturing considerations beyond the scope of this disclosure may be used within the broad scope of the embodiments.

Figure 2:
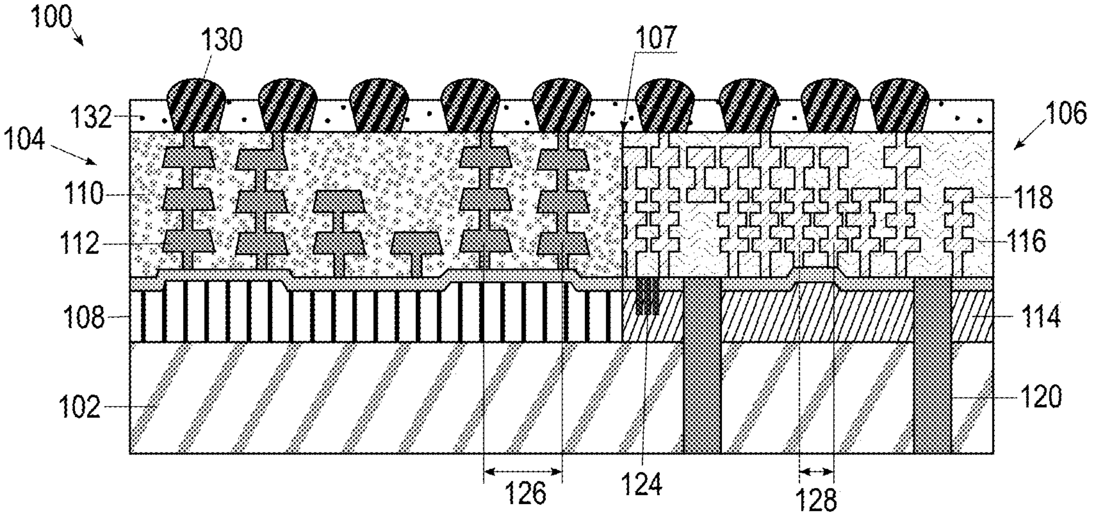
FIG. 2 is a simplified cross-sectional view of an example IC die according to some embodiments of the present disclosure.

FIG. 2 is a simplified cross-sectional view of structures in IC die 100 according to some embodiments of the present disclosure. The embodiment shown in the figure is substantially similar to the embodiment of FIG. 1, except that portion 106 does not extend over portion 104. Instead, portions 104 and 106 are adjacent to each other, in contact along interface 107. In some embodiments, although portions 104 and 106 may have the same overall thickness, individual metal layers may be of different thicknesses so that portion 104 may have conductive traces 112 disposed in a different number of layers than conductive traces 118 in portion 106. In the example shown, there are 3 metal layers in portion 104 and 4 metal layers in portion 106, as conductive traces 118 in portion 106 are thinner than conductive traces 112 in portion 104. Other numbers of metal layers are envisaged within the broad scope of the embodiments. Such an arrangement may exist in embodiments described in reference to other figures herein.

Figure 3:
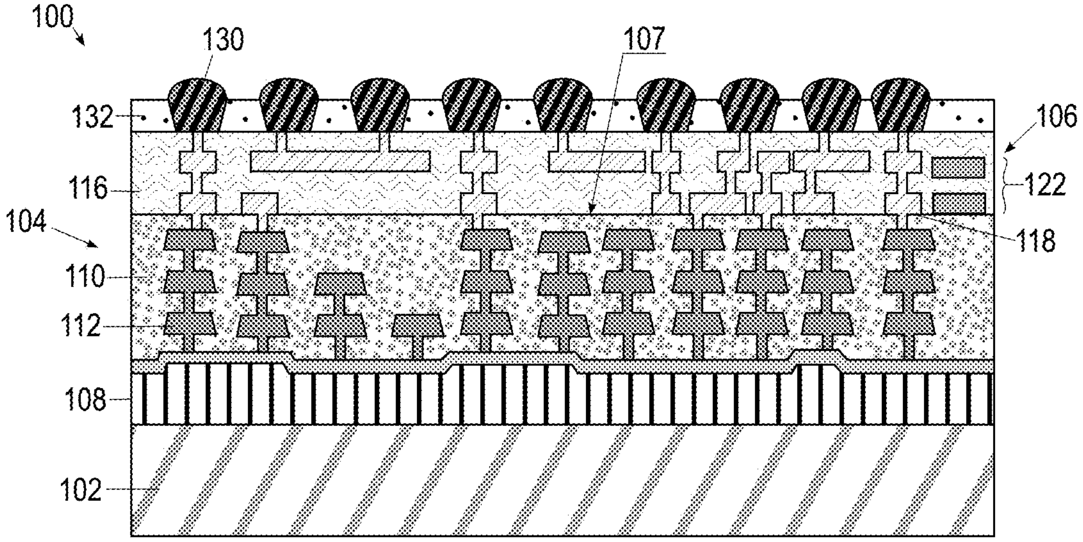
FIG. 3 is a simplified cross-sectional view of an example IC die according to some embodiments of the present disclosure.

FIG. 3 is a simplified cross-sectional view of structures in IC die 100 according to some embodiments of the present disclosure. The embodiment shown in the figure is substantially similar to the embodiment of FIG. 1, except that portion 106 is only over portion 104. In such embodiments, there is no active region 114 of portion 106, for example, or other structural features that may be found proximate to active region 114, such as trench capacitors 124, etc. In some such embodiments, TSVs 120 may also be absent, although in other embodiments, TSVs 120 may be present.

Figure 4:
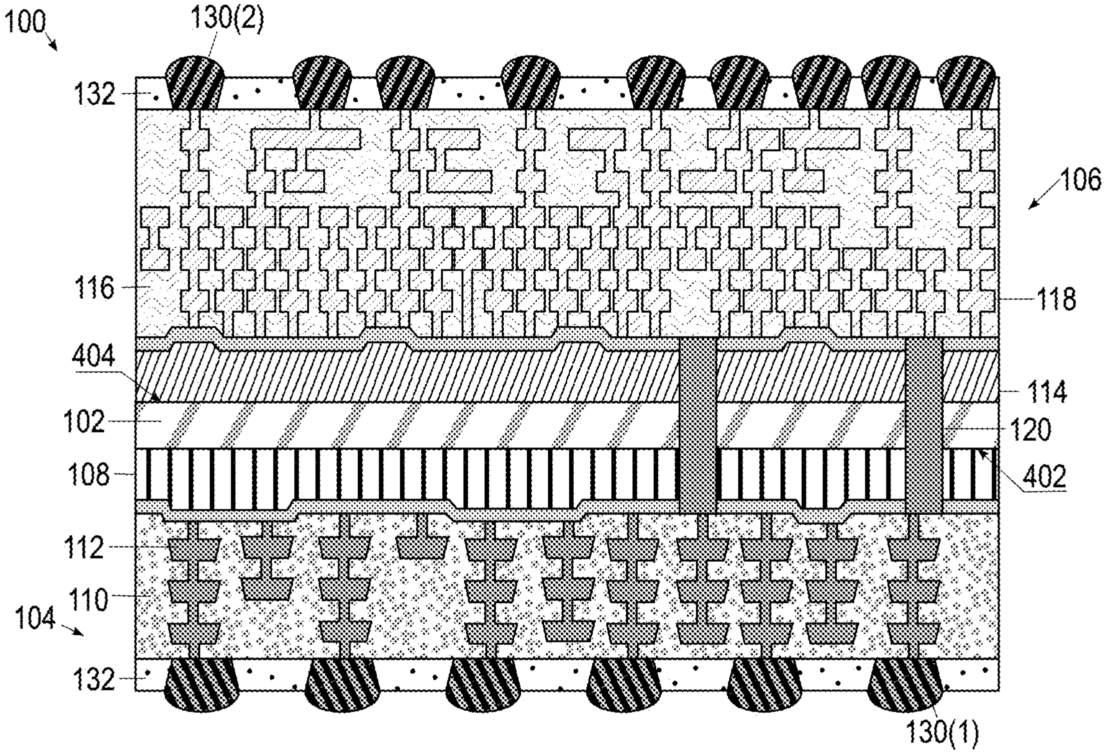
FIG. 4 is a simplified cross-sectional view of an example IC die according to some embodiments of the present disclosure.

FIG. 4 is a simplified cross-sectional view of structures in IC die 100 according to some embodiments of the present disclosure. The embodiment shown in the figure is similar to the embodiment of FIG. 1, except that substrate 102 has two opposing sides, 402 and 404, with portion 104 being on side 402 of substrate 102, and portion 106 being on opposing side 404 of substrate 102. In some such embodiments, TSVs 120 may extend between active region 108 in portion 104 and active region 114 in portion 406.

Figure 5:
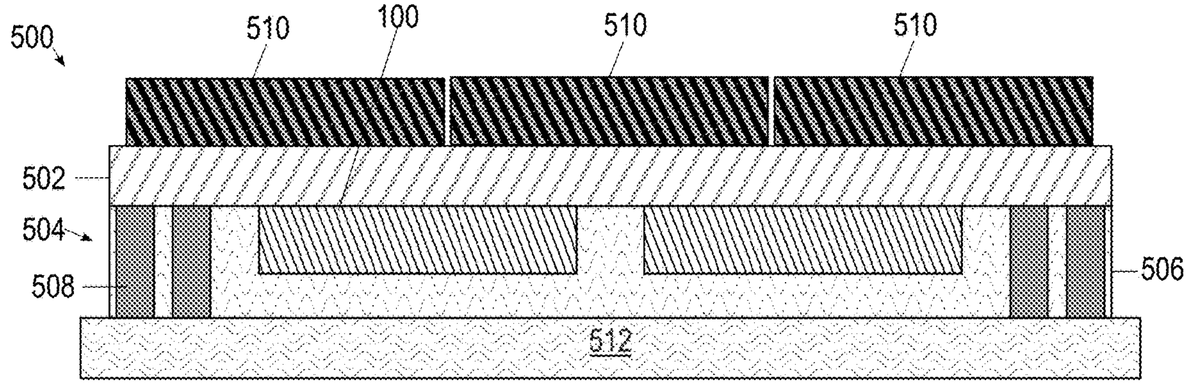
FIG. 5 is a simplified cross-sectional view of an example microelectronic assembly according to some embodiments of the present disclosure.

FIG. 5 is a simplified cross-sectional view of a microelectronic assembly 500 according to some embodiments of the present disclosure. Microelectronic assembly 500 comprises IC die 100 directly attached to another IC die 502. IC die 100 may comprise structures as described in any one or more of FIGS. 1-4. IC die 100 may be directly attached to IC die 502 by interconnects (not shown for ease of illustration). The interconnects may comprise FLIs in some embodiments as described in the previous subsection. In some embodiments, a plurality of IC die 100 may be attached to IC die 502. IC die 100 may be embedded in an interposer 504, comprising an organic dielectric material 506 with through-dielectric vias (TDVs) 508 therein. TDVs 508 may comprise copper. Examples of organic dielectric material 506 include mold compounds and epoxy-based materials with fillers. IC die 510 may be directly attached to a side of IC die 502 opposite to IC die 100. Interposer 504 may be directly attached to a package substrate 512 in some embodiments by SLIs or mid-level interconnects (MLIs). MLIs may be substantially similar to SLIs except MLIs are smaller in size than SLIs. In other embodiments, interposer 504 may be directly attached to a motherboard. Note that various other structural details (e.g., redistribution layers, interconnects, etc.) are not shown merely for ease of illustration and not as limitations.

In various embodiments, IC die 502 may include network circuits (e.g., fabric, memory controller, L2 cache, etc.). In some embodiments, TDVs 508 may be conductively coupled to SOC circuits and peripheral interconnect (PHY) circuits disposed along a periphery of IC die 502. In various embodiments, IC die 510 may include compute circuits (e.g., graphic processing unit (GPU), central processing unit (CPU), etc.). In various embodiments, IC die 100 may comprise high-capacity tightly coupled cached DRAM (TCCD) circuits with more DRAM circuits than SRAM circuits; in other embodiments, IC die 100 may comprise high-bandwidth TCCD circuits with more SRAM circuits than DRAM circuits.

Figure 6:
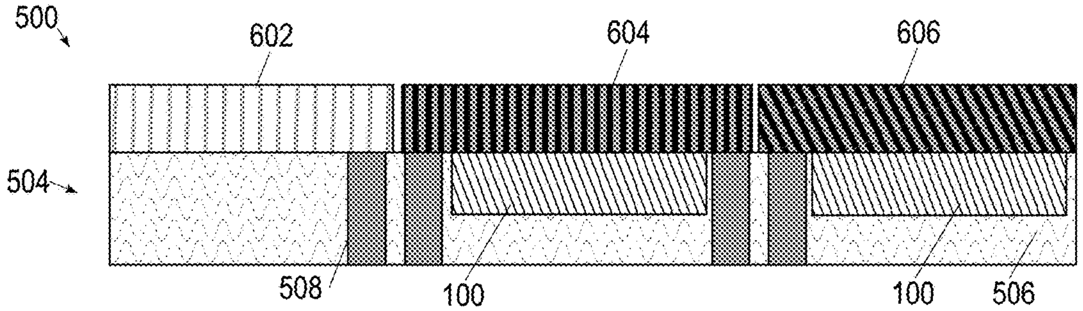
FIG. 6 is a simplified cross-sectional view of an example microelectronic assembly according to some embodiments of the present disclosure.

FIG. 6 is a simplified cross-sectional view of microelectronic assembly 500 according to some embodiments of the present disclosure. Note that package substrate 512 is not shown merely for ease of illustration. Microelectronic assembly 500 comprises one or more IC die 100 directly attached to other IC dies 602, 604, 606, etc. by suitable interconnects (not shown). In the figure, IC die 100 is shown attached only to IC dies 604 and 606 merely to indicate that some IC dies (e.g., 602) may not have IC die 100 attached thereto. IC die 100 may be comprised in interposer 504, comprising organic dielectric material 506 with TDVs 508 therethrough. Each one of IC die 100 may comprise structures as described in reference to FIGS. 1-4. In various embodiments, IC die 602 may include some type of circuits such as CPU, IC die 604 may include other types of circuits such as SOC, and IC die 606 may include yet other types of circuits such as GPU. In some embodiments, IC die 100 may include high-capacity TCCD circuits.

Figure 7A:
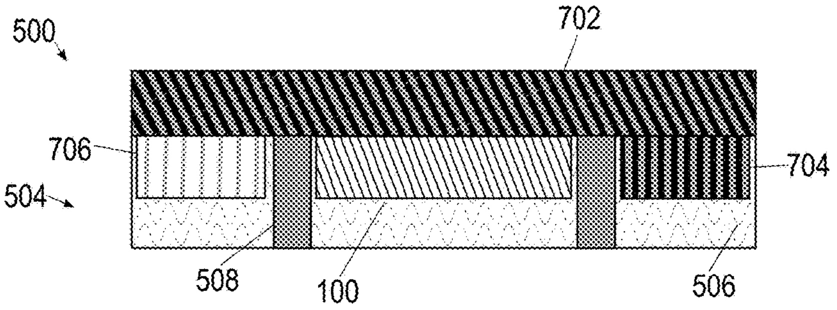
FIG. 7A is a simplified cross-sectional view of an example microelectronic assembly according to some embodiments of the present disclosure.

FIG. 7A is a simplified cross-sectional view of microelectronic assembly 500 according to some embodiments of the present disclosure. Note that package substrate 512 is not shown merely for ease of illustration. Microelectronic assembly 500 comprises one or more IC die 100 directly attached to another IC die 702 by suitable interconnects (not shown). Yet other IC dies 704 and 706 may also be attached to IC die 702. IC die 100, 704 and 706 may be disposed in interposer 504, comprising organic dielectric material 506 with TDVs 508 therethrough. Each one of IC die 100 may comprise structures as described in reference to any one or more of FIGS. 1-4. In various embodiments, IC die 702 may include some type of circuits such as GPU, IC die 704 may include other types of circuits such as PHY circuits, and IC die 706 may include yet other types of circuits such as SOC. In some embodiments, IC die 100 may include high-capacity TCCD circuits.

Figure 7B:
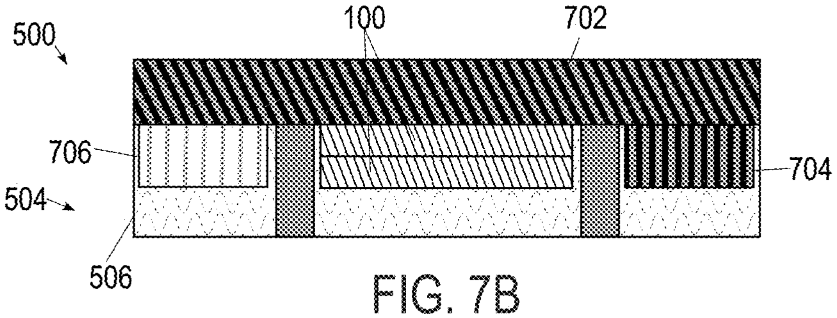
FIG. 7B is a simplified cross-sectional view of an example microelectronic assembly according to some embodiments of the present disclosure.

FIG. 7B is a simplified cross-sectional view of microelectronic assembly 500 according to some embodiments of the present disclosure. Note that package substrate 512 is not shown merely for ease of illustration. Microelectronic assembly 500 is substantially similar to the embodiment of FIG. 7A except that IC die 100 comprises (or is replaced by) a stack of similar IC die 100, arranged one on top of another. In some embodiments, IC die 100 may include high-capacity TCCD circuits. Each one of IC die 100 may comprise structures as described in reference to any one or more of FIGS. 1-4. The stack of IC die 100 may be assembled together in interposer 504 in place of a single one of IC die 100. The stack of IC die 100 can provide increased capacity in those applications where more capacity is desirable. Any number of IC die 100 may be included in the stack according to particular needs within the broad scope of the embodiments.

Figure 8:
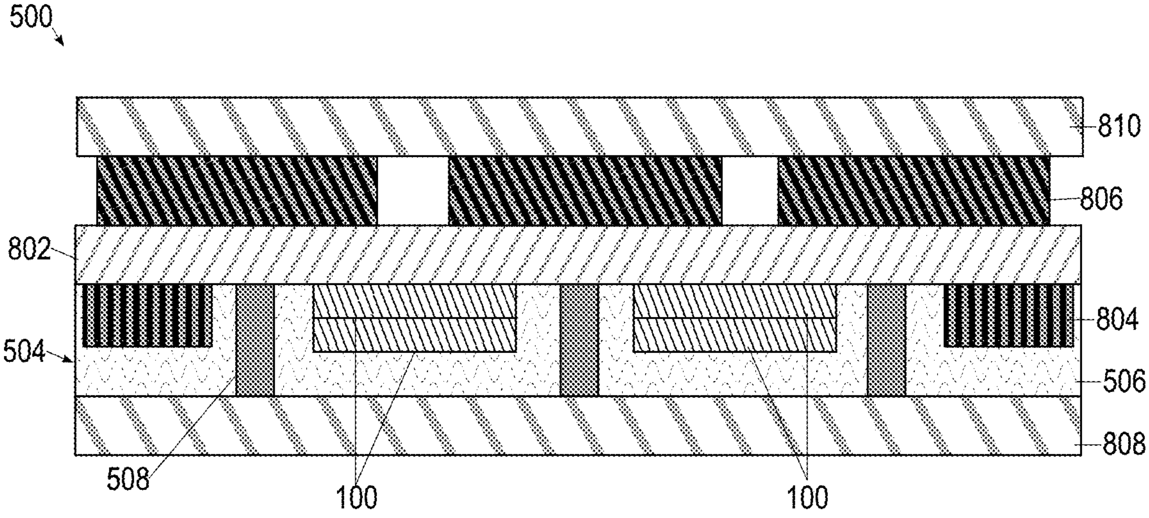
FIG. 8 is a simplified cross-sectional view of an example microelectronic assembly according to some embodiments of the present disclosure.

FIG. 8 is a simplified cross-sectional view of microelectronic assembly 500 according to some embodiments of the present disclosure. Note that package substrate 512 is not shown merely for ease of illustration. Microelectronic assembly 500 comprises an IC die 802 having IC die 100 and another IC die 804 coupled on one side and yet another IC die 806 coupled on an opposing side. Each of IC die 100, 804 and/or 806 may comprise a stack of IC dies having similar functionalities. In some embodiments, IC die 802 may comprise a fabric (e.g., network) circuit, IC die 804 may comprise a PHY circuit or SOC circuit and IC die 806 may comprise a compute circuit (e.g., CPU, GPU). IC die 100 and IC die 804 may be embedded in organic dielectric material 506 in interposer 504. Each one of IC die 100 may comprise structures as described in reference to any one or more of FIGS. 1-4. Structures 808 and 810 may be provisioned on either side of the assembly (e.g., bottom and top respectively) to facilitate providing power to IC dies 804 and 806 substantially independently. For example, power may be delivered to IC die 804 from bottom structure 808 through TDVs 508 and IC die 802, whereas power may be delivered independently to IC dies 806 by way of top structure 810. Structures 808 and 810 may comprise printed circuit boards, with power delivery networks associated thereto, including inductors, voltage regulators and power sources, as appropriate. In some embodiments, providing power to compute circuits in IC die 806 through structure 808 proximate thereto may be more efficient than providing power through TSVs or other conductive structures in IC die 802.

Figure 9:
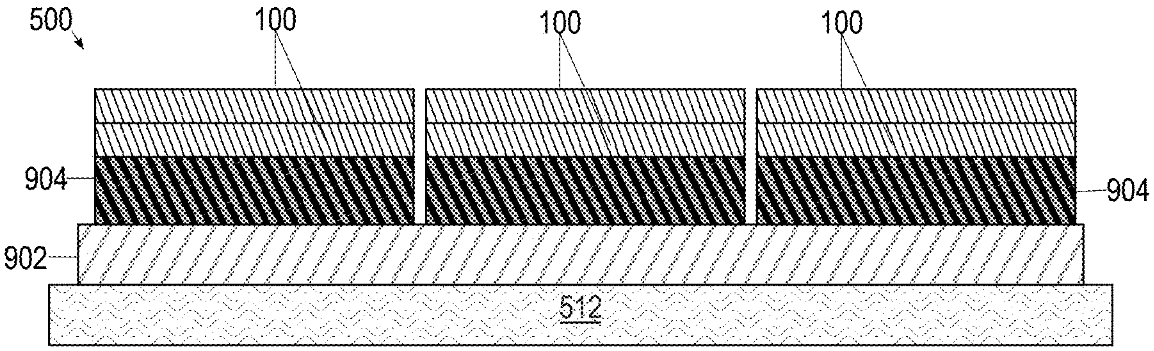
FIG. 9 is a simplified cross-sectional view of an example microelectronic assembly according to some embodiments of the present disclosure.

FIG. 9 is a simplified cross-sectional view of microelectronic assembly 500 according to some embodiments of the present disclosure. Microelectronic assembly 500 comprises an IC die 902 coupled to package substrate 512. IC dies 904 may be coupled to IC die 902 on a side of IC die 902 opposite to package substrate 512. IC die 100 may be coupled to IC dies 904 so as to form stacks of IC dies. In various embodiments, IC dies 904 may comprise graphics or compute circuits and memory controller circuits. IC die 902 may comprise a fabric circuit facilitating communicative coupling between different stacks of IC dies. Each one of IC die 100 may comprise structures as described in reference to any one or more of FIGS. 1-4. Such embodiments differ from those shown in reference to FIGS. 5-8 in that IC dies 904 and 100 are coupled only to one side of IC die 902 rather than to both sides. Consequently, in such embodiments, IC die 100 may not be disposed in an interposer, but may be attached directly to other IC dies, such as IC dies 904.

FIG. 10 is a simplified cross-sectional view of microelectronic assembly 500 according to some embodiments of the present disclosure. Note that package substrate 512 is not shown merely for ease of illustration. Microelectronic assembly 500 is substantially similar to the embodiment of FIG. 9 except that IC die 100 (and/or stacks thereof) are directly attached to IC die 1002, which comprises fabric circuits. IC die 100 may comprise high-bandwidth TCCD circuits in some embodiments. Each one of IC die 100 may comprise structures as described in reference to any one or more of FIGS. 1-4. IC die 1004 comprising, for example, graphics or compute circuits and memory controller circuits may be provisioned adjacent to IC die 100. Such a configuration may provide heat transfer advantages, for example, by attaching a heat sink to IC die 1004 directly on respective sides opposite to IC die 1002.

Figure 11:
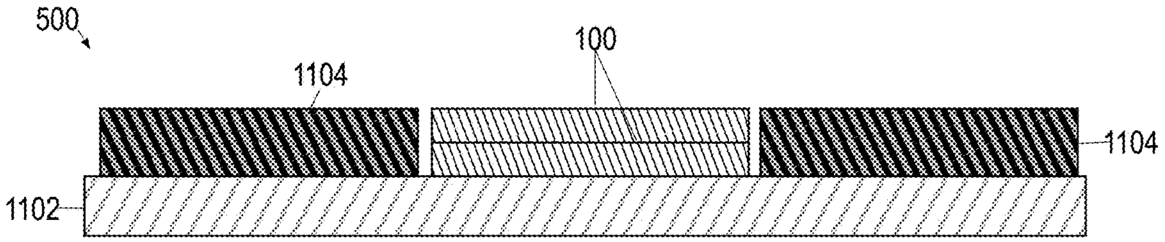
FIG. 11 is a simplified cross-sectional view of an example microelectronic assembly according to some embodiments of the present disclosure.

FIG. 11 is a simplified cross-sectional view of microelectronic assembly 500 according to some embodiments of the present disclosure. Note that package substrate 512 is not shown merely for ease of illustration. Microelectronic assembly 500 is substantially similar to the embodiment of FIG. 10 except that IC die 100 (and/or stacks thereof) are placed towards a medial region of IC die 1102, away from peripheral regions. IC dies 1104 may be coupled to the peripheral regions. IC die 100 may comprise high-bandwidth TCCD circuits in some embodiments. Each one of IC die 100 may comprise structures as described in reference to any one or more of FIGS. 1-4. By locating IC die 100 in the medial regions, IC dies 1104 that access memory circuits in IC die 100 may be equidistant therefrom, which can be advantageous in certain applications.

Figure 12:
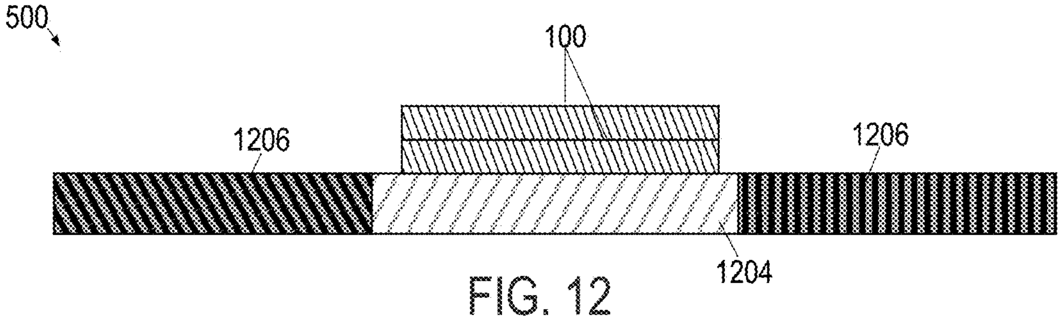
FIG. 12 is a simplified cross-sectional view of an example microelectronic assembly according to some embodiments of the present disclosure.

FIG. 12 is a simplified cross-sectional view of microelectronic assembly 500 according to some embodiments of the present disclosure. Note that package substrate 512 is not shown merely for ease of illustration. Microelectronic assembly 500 is substantially similar to the embodiment of FIG. 11 except that the graphics, memory controller, PHY, SOC or other such circuits provisioned in IC dies 1104 may be moved into IC die 1204, for example, along peripheral regions of IC die 1204 as circuits 1206. IC die 100 (and/or stacks thereof) may be attached to IC die 1204 and may be conductively coupled to circuits 1206 through suitable conductive pathways in IC die 1204. IC die 100 may comprise high-capacity TCCD circuits in some embodiments. Each one of IC die 100 may comprise structures as described in reference to any one or more of FIGS. 1-4.

Figure 13:
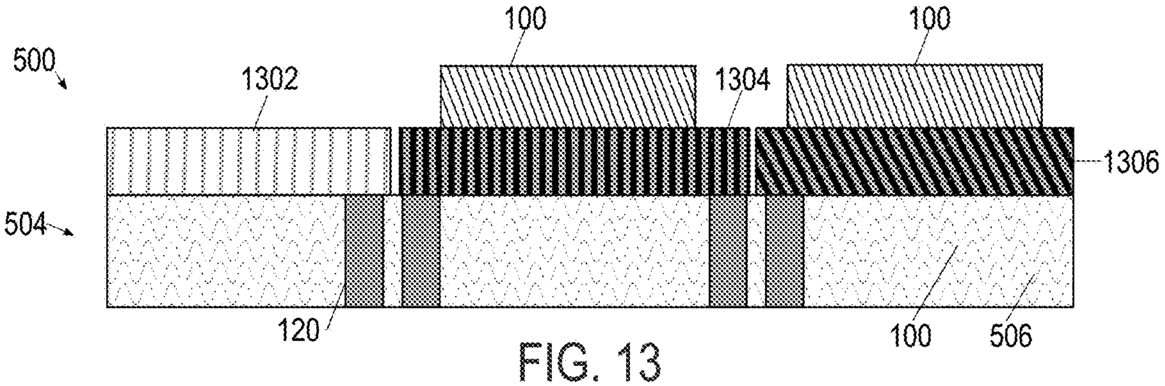
FIG. 13 is a simplified cross-sectional view of an example microelectronic assembly according to some embodiments of the present disclosure.

FIG. 13 is a simplified cross-sectional view of microelectronic assembly 500 according to some embodiments of the present disclosure. Note that package substrate 512 is not shown merely for ease of illustration. Microelectronic assembly 500 may comprise interposer 504 to which are attached various IC dies 1302, 1304, 1306, etc. IC die 100 may be coupled to one or more of IC dies 1302-1306 on respective sides of IC dies 1302-1306 opposite to interposer 504. Some of IC dies 1302-1306 (such as IC die 1302 shown in the figure) may not have any IC die 100 coupled thereto. Interposer 504 may be attached to package substrate 512 (not shown) on a side of interposer 504 opposite to IC dies 1302-1306. IC die 100 may comprise high-capacity TCCD circuits. Each one of IC die 100 may comprise structures as described in reference to any one or more of FIGS. 1-4. In various embodiments, one or more of IC dies 1302-1306 may comprise various circuits, such as compute circuits, graphics circuits, and SOC circuits.

In various embodiments, any of the features discussed with reference to any of FIGS. 1-13 herein may be combined with any other features to form a package with one or more IC dies as described herein. For example, some microelectronics assemblies on a circuit board may conform to the structures shown and described in reference to FIGS. 9-13 and some other microelectronic assemblies on the circuit board may conform to the structures shown and described in reference to FIGS. 5-8. Some such combinations are described above, but, in various embodiments, further combinations and modifications are possible. Various different embodiments described in different figures may be combined suitably based on particular needs within the broad scope of the embodiments.

Example Methods

Figure 14:
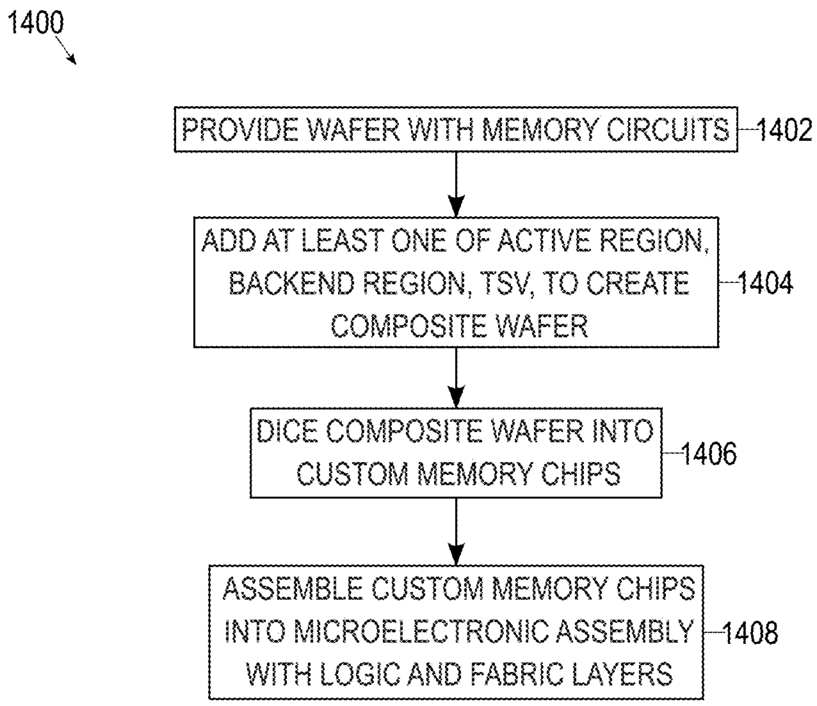
FIG. 14 is a flow diagram of example operations that may be associated with fabricating an IC die according to some embodiments of the present disclosure.

FIG. 14 is a schematic flow diagram showing various operations 1400 that may be associated with fabricating IC die 100 according to some embodiments of the present disclosure. At 1402, a wafer may be provided with one or more memory circuits. The memory circuits and the structures on the wafer may correspond to portion 104 of FIGS. 1-4 in various embodiments. At 1404, at least one of active region 114, backend region 116 and/or TSVs 120 may be formed adjacent to, around, or proximate to portion 104. Such structures formed in operation 1404 may correspond to portion 106 of FIGS. 1-4. Thus, a composite wafer may be created having two distinct regions corresponding to portions 104 and 106. At 1406, the composite wafer may be diced into custom memory chips, each of which corresponds to IC die 100 as described in one or more of FIGS. 1-4. At 1408, the custom memory chips (i.e., IC die 100) may be assembled into microelectronic assembly 500 with logic and fabric layers as described in reference to any one or more of FIGS. 5-13. Assembling may comprise forming appropriate interconnects (e.g., FLIs, SLIs, etc.) between various components of microelectronic assembly 500. Some such embodiments may facilitate creating custom memory chips assembled in microelectronic assemblies and providing various functional advantages, including high-bandwidth memory circuits, high-capacity memory circuits, etc. in a single IC die at cheaper or more efficient manufacturing costs than if the high-bandwidth and/or high-capacity memory circuits were created individually and/or separately in distinct IC dies.

Although FIG. 14 illustrate various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIG. 14 may be modified in accordance with the present disclosure to fabricate others of IC die 100 and/or microelectronic assembly 500 disclosed herein. Although various operations are illustrated in FIG. 14 once each, the operations may be repeated as often as desired. For example, one or more operations may be performed in parallel to manufacture and test multiple IC dies and/or microelectronic assemblies substantially simultaneously. In another example, the operations may be performed in a different order to reflect the structure of a particular microelectronic assembly in which one or more IC dies or other components as described herein may be included.

Furthermore, the operations illustrated in FIG. 14 may be combined or may include more details than described. For example, the operations may be modified suitably without departing from the scope of the disclosure for IC dies that do not have a semiconductor substrate, but rather, are fabricated on other materials, such as glass or ceramic materials. Still further, the various operations shown and described may further include other manufacturing operations related to fabrication of other components of the microelectronic assemblies described herein, or any devices that may include the IC dies and/or microelectronic assemblies as described herein. For example, the operations not shown in the figure may include various cleaning operations, additional surface planarization operations, operations for surface roughening, operations to include barrier and/or adhesion layers as desired, and/or operations for incorporating microelectronic assemblies as described herein in, or with, an IC component, a computing device, or any desired structure or device.

Example Devices and Components

Figure 15:
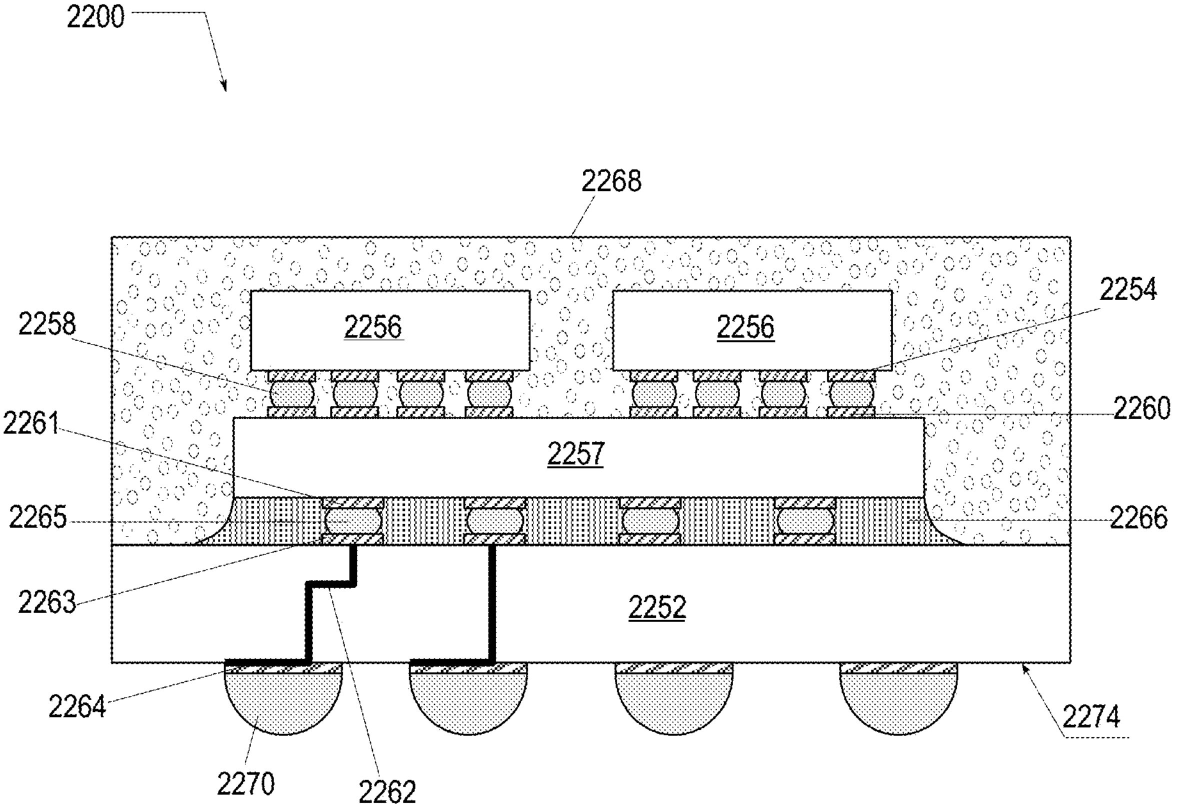
FIG. 15 is a cross-sectional view of a device package that includes one or more microelectronic assemblies in accordance with any of the embodiments disclosed herein.
Figure 16:
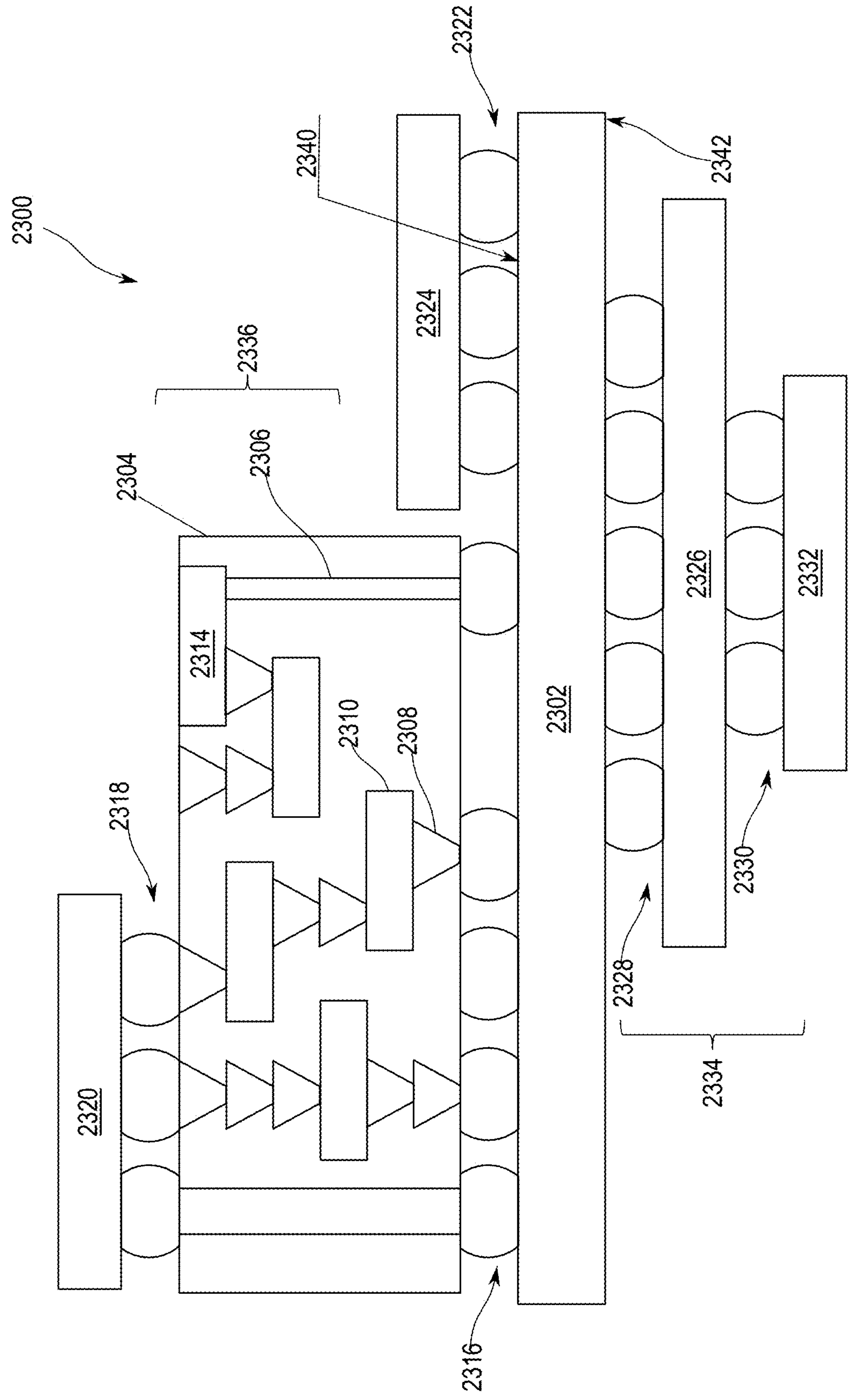
FIG. 16 is a cross-sectional side view of a device assembly that includes one or more microelectronic assemblies in accordance with any of the embodiments disclosed herein.
Figure 17:
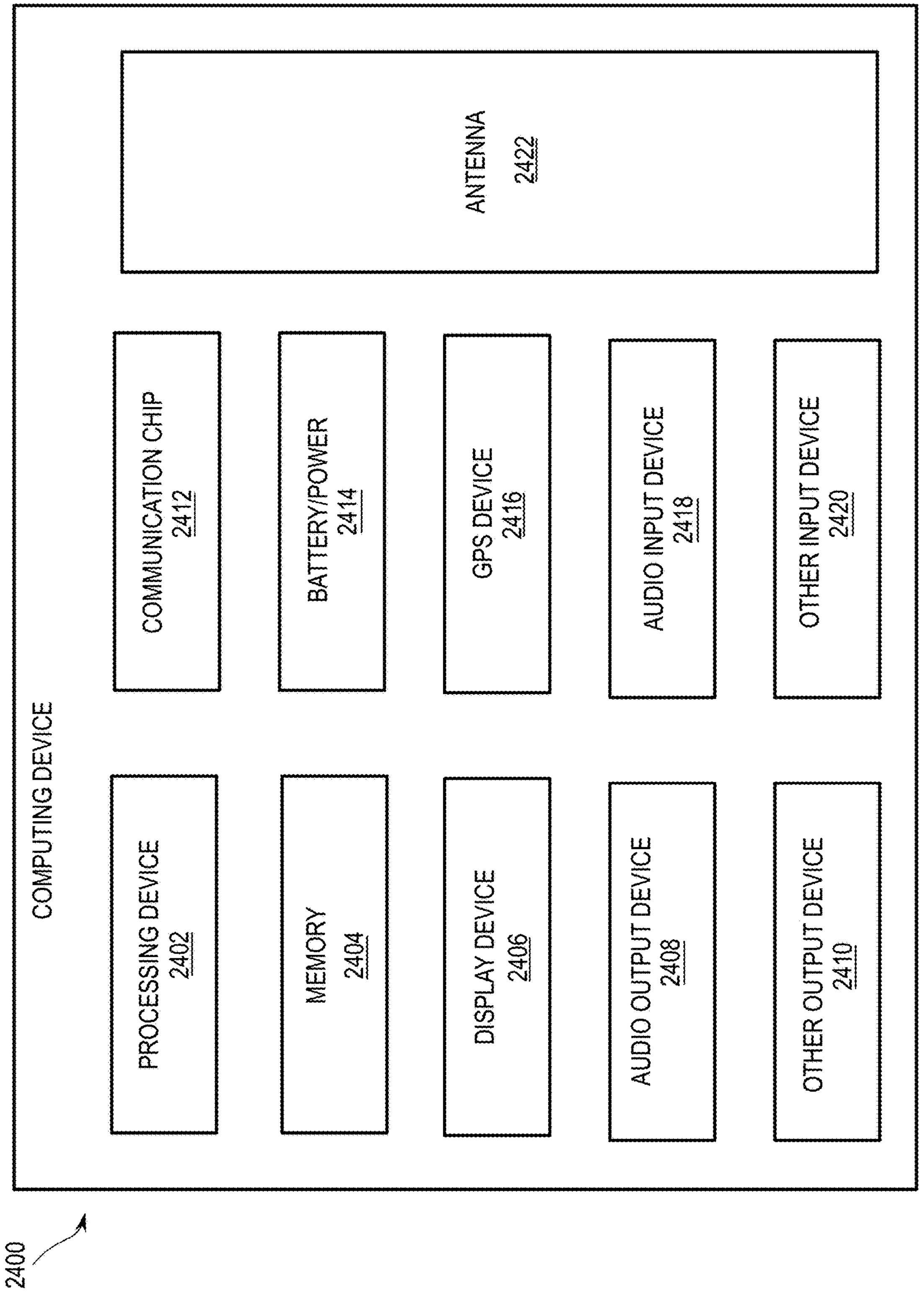
FIG. 17 is a block diagram of an example computing device that includes one or more microelectronic assemblies in accordance with any of the embodiments disclosed herein.

The packages disclosed herein, e.g., any of the embodiments shown in FIGS. 1-14 or any further embodiments described herein, may be included in any suitable electronic component. FIGS. 15-17 illustrate various examples of packages, assemblies, and devices that may be used with or include any of the IC packages as disclosed herein.

FIG. 15 is a side, cross-sectional view of an example IC package 2200 that may include IC packages in accordance with any of the embodiments disclosed herein. In some embodiments, the IC package 2200 may be a SIP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 16.

In various embodiments, any of dies 2256 may be IC die 100 or microelectronic assembly 500 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being IC die 100 or microelectronic assembly 500 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 16 is a cross-sectional side view of an IC device assembly 2300 that may include components having one or more IC die 100 or microelectronic assembly 500 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more IC die 100 or microelectronic assembly 500 in accordance with any of the embodiments disclosed herein; e.g., any of the IC packages discussed below with reference to IC device assembly 2300 may take the form of any of the embodiments of IC package 2200 discussed above with reference to FIG. 15.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 15. In some embodiments, IC package 2320 may include at least one microelectronic assembly 500 as described herein. IC die 100 or microelectronic assembly 500 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 17 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 15). In yet another example, any one or more of the components of computing device 2400 may include an IC device assembly 2300 (e.g., as shown in FIG. 16).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded DRAM (eDRAM) or spin transfer torque magnetic random-access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

Example 1 provides a microelectronic assembly (e.g., 500, FIG. 9), comprising: a first IC die (e.g., 100, FIG. 1) having a first memory circuit and a second memory circuit; a second IC die (e.g., 902); a third IC die (e.g., 904); and a package substrate (e.g., 512), wherein: the second IC die is between the first IC die and the package substrate, the first IC die comprises: a first portion (e.g., 104) comprising a first active region (e.g., 108) and a first backend region (e.g., 110) in contact with the first active region; and a second portion (e.g., 106) comprising a second active region (e.g., 114) and a second backend region (e.g., 116) in contact with the second active region, the first memory circuit is in the first portion, the second memory circuit is in the second portion, the first active region comprises transistors that are larger than transistors in the second active region, and the first backend region comprises conductive traces (e.g., 112) that have a larger pitch (e.g., 126) than conductive traces (e.g., 118) in the second backend region.

Example 2 provides the microelectronic assembly of example 1, wherein: the first memory circuit is a DRAM circuit, and the second memory circuit is a SRAM circuit.

Example 3 provides the microelectronic assembly of example 1, wherein the first memory circuit and the second memory circuit are DRAM circuits.

Example 4 provides the microelectronic assembly of example 1, wherein the first memory circuit and the second memory circuit are SRAM circuits.

Example 5 provides the microelectronic assembly of any one of examples 1-4, wherein: the third IC die is between the first IC die and the second IC die.

Example 6 provides the microelectronic assembly of any one of examples 1-5, wherein: the first IC die comprises a stacked plurality of first IC dies, each of the first IC dies in the stacked plurality of first IC dies having a SRAM circuit and a DRAM circuit.

Example 7 provides the microelectronic assembly of any one of examples 1-6, wherein (e.g., FIG. 13): an organic dielectric material (e.g., 506) is between the second IC die and the package substrate, and TDVs (e.g., 120) through the organic dielectric material conductively couple the second IC die (e.g., 1304) and the package substrate.

Example 8 provides the microelectronic assembly of any one of examples 1-7, wherein: the second IC die comprises a network circuit, and the third IC die comprises one or more compute circuits.

Example 9 provides the microelectronic assembly of any one of examples 1-6, wherein (e.g., FIGS. 10, 11): the first IC die is coupled to the second IC die (e.g., 1002), the third IC die (e.g., 1004) is adjacent to the first IC die, and the third IC die is coupled to the second IC die.

Example 10 provides the microelectronic assembly of any one of examples 1-6, wherein (e.g., FIG. 12): the third IC die comprises another SRAM circuit and another DRAM circuit in structures substantially similar to the first IC die, and the third IC die is between the first IC die and the second IC die.

Example 11 provides the microelectronic assembly of example 10, wherein: the second IC die comprises a network circuit (e.g., 1202), a system on chip circuit (e.g., 1204) and a peripheral interface circuit (e.g., 1206).

Example 12 provides an IC structure (e.g., 100, FIG. 1A), comprising: a substrate (e.g., 102) comprising a semiconductor material; a first portion (e.g., 104) comprising a first active region (e.g., 108) and a first backend region (e.g., 110); and a second portion (e.g., 106) comprising a second active region (e.g., 114) and a second backend region (e.g., 116), wherein: the first portion is in contact with the second portion along an interface (e.g., 107), the first active region and the second active region are in the substrate, the first active region comprises transistors that are larger than transistors in the second active region, the first backend region comprises conductive traces (e.g., 112) that have a larger pitch (e.g., 126) than conductive traces (e.g., 118) in the second backend region, and the IC structure is part of a first IC die coupled to a second IC die, the second IC die being attached to at least one of: a third IC die, an interposer, or a package substrate on a side of the second IC die opposite to the first IC die.

Example 13 provides the IC structure of example 12, wherein the transistors in the first active region and the conductive traces in the first backend region are part of one or more memory circuits.

Example 14 provides the IC structure of any one of examples 12-13, wherein: the first backend region comprises a first number of metal layers, the second backend region comprises a second number of metal layers, the first number is smaller than the second number.

Example 15 provides the IC structure of any one of examples 12-14, wherein: the first active region does not contain any TSVs (e.g., 120) therethrough, and the second active region comprises one or more TSVs therethrough.

Example 16 provides the IC structure of example 15, wherein the TSVs extend through a thickness of the substrate.

Example 17 provides the IC structure of any one of examples 12-16, wherein: the first backend region does not contain MIM capacitors (e.g., 122), and the second backend region comprises MIM capacitors.

Example 18 provides the IC structure of any one of examples 12-17, wherein: the first active region does not contain trench capacitors (e.g., 124), and the second active region comprises trench capacitors.

Example 19 provides the IC structure of any one of examples 12-18, further comprising interconnects (e.g., 130) configured to be coupled to the second IC die.

Example 20 provides the IC structure of example 19, further comprising a layer (e.g., 132) comprising organic dielectric material adjacent to the interconnects.

Example 21 provides the IC structure of any one of examples 12-20, wherein: the first backend region comprises a first inorganic dielectric material, the second backend region comprises a second inorganic dielectric material, and the first inorganic dielectric material is different from the second inorganic dielectric material.

Example 22 provides the IC structure of any one of examples 12-21, wherein the second backend region further extends over the first backend region.

Example 23 provides the IC structure of any one of examples 12-21, wherein (e.g., FIG. 1B) the first portion is surrounded by the second portion.

Example 24 provides the IC structure of any one of examples 12-21, wherein (e.g., FIG. 1C) the second portion is surrounded by the first portion.

Example 25 provides an IC structure (e.g., 100, FIG. 3), comprising: a substrate (e.g., 102) comprising a semiconductor material; a first portion (e.g., 104) comprising an active region (e.g., 108) and a first backend region (e.g., 110); and a second portion (e.g., 106) comprising a second backend region (e.g., 116), wherein: the second backend region has a first side and an opposing second side, the first backend region is in contact with the first side of the second backend region, interconnects are on the second side of the second backend region, the first backend region comprises conductive traces (e.g., 112) that have a larger pitch (e.g., 126) than conductive traces (e.g., 118) in the second backend region, and the IC structure is part of a first IC die coupled to a second IC die, the second IC die being attached to at least one of: a third IC die, an interposer, or a package substrate on a side of the second IC die opposite to the first IC die.

Example 26 provides the IC structure of example 25, wherein: the first backend region has a first number of metal layers, the second backend region has a second number of metal layers, and the first number is at least one of: (1) greater than the second number, (2) equal to the second number, or (3) less than the second number.

Example 27 provides the IC structure of any one of examples 25-26, wherein: the conductive traces in the first backend region are thicker than the conductive traces in the second backend region.

Example 28 provides the IC structure of any one of examples 25-27, wherein: the first backend region has a first dielectric material, the second backend region has a second dielectric material, and the first dielectric material is different from the second dielectric material.

Example 29 provides the IC structure of any one of examples 25-28, wherein: the interconnects are in a redistribution layer, and the redistribution layer is in contact with the second side of the second backend region.

Example 30 provides the IC structure of any one of examples 25-29, wherein (e.g., FIG. 1B) the first portion is surrounded by the second portion.

Example 31 provides the IC structure of any one of examples 25-29, wherein (e.g., FIG. 1C) the second portion is surrounded by the first portion.

Example 32 provides an IC structure (e.g., 100, FIG. 4), comprising: a substrate (e.g., 102) comprising a semiconductor material, the substrate having a first side (e.g., 402) and an opposing second side (e.g., 404); a first portion (e.g., 104) comprising a first active region (e.g., 108) and a first backend region (e.g., 110); and a second portion (e.g., 106) comprising a second active region and a second backend region (e.g., 116), wherein: the first portion is on the first side of the substrate, the second portion is on the second side of the substrate, the first active region comprises transistors that are larger than transistors in the second active region, the first backend region comprises conductive traces (e.g., 112) that have a larger pitch (e.g., 126) than conductive traces (e.g., 118) in the second backend region, and the IC structure is part of a first IC die coupled to a second IC die, the second IC die being attached to at least one of: a third IC die, an interposer, or a package substrate on a side of the second IC die opposite to the first IC die.

Example 33 provides the IC structure of example 32, further comprising: TSVs through the substrate, conductively coupling the first portion and the second portion.

Example 34 provides the IC structure of any one of examples 32-33, further comprising first interconnects coupled to the first portion and second interconnects coupled to the second portion, wherein the first interconnects have a larger pitch than the second interconnects.

Example 35 provides the IC structure of example 34, further comprising a first redistribution layer in contact with the first portion and a second redistribution layer in contact with the second portion, wherein: the first interconnects are in the first redistribution layer, and the second interconnects are in the second redistribution layer.

Example 36 provides the IC structure of any one of examples 32-35, wherein: the first backend region has a first number of metal layers, the second backend region has a second number of metal layers, and the first number is at least one of: (1) greater than the second number, (2) equal to the second number, or (3) less than the second number.

Example 37 provides the IC structure of any one of examples 32-36, wherein (e.g., FIG. 1B) the first portion is surrounded by the second portion.

Example 38 provides the IC structure of any one of examples 32-36, wherein (e.g., FIG. 1C) the second portion is surrounded by the first portion.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:

a first integrated circuit (IC) die having a first memory circuit and a second memory circuit;

a second IC die;

a third IC die; and a package substrate, wherein:

the second IC die is between the first IC die and the package substrate, the first IC die comprises:

a first portion comprising a first active region and a first backend region in contact with the first active region; and a second portion comprising a second active region and a second backend region in contact with the second active region, the first memory circuit is in the first portion, the second memory circuit is in the second portion, the first active region comprises transistors that are larger than transistors in the second active region, and the first backend region comprises conductive traces that have a larger pitch than conductive traces in the second backend region.

2. The microelectronic assembly of claim 1, wherein:

the first memory circuit is a dynamic random-access memory (DRAM) circuit, and the second memory circuit is a static random-access memory (SRAM) circuit.

3. The microelectronic assembly of claim 1, wherein the first memory circuit and the second memory circuit are DRAM circuits.

4. The microelectronic assembly of claim 1, wherein the first memory circuit and the second memory circuit are SRAM circuits.

5. The microelectronic assembly of claim 1, wherein: the third IC die is between the first IC die and the second IC die.

6. The microelectronic assembly of claim 1, wherein: the first IC die comprises a stacked plurality of first IC dies, each of the first IC dies in the stacked plurality of the first IC dies having a SRAM circuit and a DRAM circuit.

7. The microelectronic assembly of claim 1, wherein:

an organic dielectric material is between the second IC die and the package substrate, and through-dielectric vias (TDVs) through the organic dielectric material conductively couple the second IC die and the package substrate.

8. The microelectronic assembly of claim 1, wherein:

the first IC die is coupled to the second IC die, the third IC die is adjacent to the first IC die, and the third IC die is coupled to the second IC die.

9. An IC structure, comprising:

a substrate comprising a semiconductor material;

a first portion comprising a first active region and a first backend region; and a second portion comprising a second active region and a second backend region, wherein:

the first portion is in contact with the second portion along an interface, the first active region and the second active region are in the substrate, the first active region comprises transistors that are larger than transistors in the second active region, the first backend region comprises conductive traces that have a larger pitch than conductive traces in the second backend region, and the IC structure is part of a first IC die coupled to a second IC die, the second IC die being attached to at least one of: a third IC die, an interposer, or a package substrate on a side of the second IC die opposite to the first IC die.

10. The IC structure of claim 9, wherein:

the first backend region comprises a first number of metal layers, the second backend region comprises a second number of metal layers, the first number is smaller than the second number.

11. The IC structure of claim 9, wherein:

the first active region does not contain any through-substrate vias (TSVs) therethrough, and the second active region comprises one or more TSVs therethrough.

12. The IC structure of claim 9, wherein:

the first backend region does not contain metal-insulator-metal (MIM) capacitors, and the second backend region comprises MIM capacitors.

13. The IC structure of claim 9, wherein:

the first active region does not contain trench capacitors, and the second active region comprises trench capacitors.

14. The IC structure of claim 9, wherein:

the first backend region comprises a first inorganic dielectric material, the second backend region comprises a second inorganic dielectric material, and the first inorganic dielectric material is different from the second inorganic dielectric material.

15. The IC structure of claim 9, wherein the second backend region further extends over the first backend region.

* * * * *